United States Patent [19]

Pfiester et al.

[11] Patent Number: 5,330,929
[45] Date of Patent: Jul. 19, 1994

[54] METHOD OF MAKING A SIX TRANSISTOR STATIC RANDOM ACCESS MEMORY CELL

[75] Inventors: James R. Pfiester; James D. Hayden, both of Austin, Tex.

[73] Assignee: Motorola, Inc., Schaumburg, Ill.

[21] Appl. No.: 955,785

[22] Filed: Oct. 5, 1992

[51] Int. Cl.[5] .................. H01L 21/70; H01L 27/00
[52] U.S. Cl. ........................... 437/52; 437/40; 437/200; 148/DIG. 59
[58] Field of Search ............. 437/52, 47; 257/903, 257/904

[56] References Cited

U.S. PATENT DOCUMENTS

| | | | |
|---|---|---|---|
| 4,481,524 | 11/1984 | Tsujide | 257/903 |
| 4,656,731 | 4/1987 | Lam et al. | 437/915 |
| 4,698,659 | 10/1987 | Mizutani | 357/42 |
| 4,804,636 | 12/1989 | Groover, III et al. | 437/52 |
| 4,883,543 | 11/1989 | Gossen, Jr. et al. | 437/52 |
| 4,890,141 | 12/1989 | Tang et al. | 257/903 |
| 4,997,785 | 3/1991 | Pfiester | 437/57 |
| 5,034,797 | 8/1991 | Yamanaka et al. | 365/156 |
| 5,162,889 | 11/1992 | Itomi | 257/69 |
| 5,179,033 | 1/1993 | Adan | 437/52 |
| 5,239,196 | 8/1993 | Ikeda et al. | 257/385 |

FOREIGN PATENT DOCUMENTS 0475688   3/1992   European Pat. Off. .

OTHER PUBLICATIONS

Chen, et al.; "Stacked CMOS SRAM Cell"; IEEE Electron Device Letters; vol. EDL-04, No. 8; pp. 272–274 (1983).

*Primary Examiner*—Olik Chaudhuri
*Assistant Examiner*—H. Jey Tsai
*Attorney, Agent, or Firm*—George R. Meyer

[57] ABSTRACT

The present invention includes a static random access memory cell and a method of forming the memory cell, wherein the memory cell may comprise an active region and a first layer. The active region including a first segment, a second segment, and a third segment, wherein 1) the first segment has an adjacent end and a distal end; 2) the second segment is generally parallel to the first segment, and has an adjacent end and a distal end; and 3) the third segment is generally perpendicular to the first direction, wherein the adjacent end of the first segment lies near one end of the third segment, wherein the adjacent end of the second segment lies near the other end of the third segment. The first layer has the a shape similar to the active region except that the first layer does not lie over the first and second segments near the distal ends. The present invention also includes a static random access memory cell and a method of forming the memory cell, wherein the memory cell may comprise shared gate electrodes that overlap one another without electrically contacting each other.

7 Claims, 9 Drawing Sheets

METHOD OF MAKING A SIX TRANSISTOR STATIC RANDOM ACCESS MEMORY CELL

FIELD OF THE INVENTION

The present invention relates to the field of semiconductor devices, and in particular, to static random access memory cells.

BACKGROUND OF THE INVENTION

As semiconductor design rules become smaller, integrated circuits occupy less substrate area. In general, smaller integrated circuits typically form faster devices and have higher substrate yields. Memory devices, which are a type of integrated circuit, need to have their memory cell area minimized. Memory cell area is a function of among other things, the design rules and the memory cell layout. Smaller design rules cannot overcome inherent limitations that exist with an inefficient memory cell layout. More efficient use of substrate area is needed to improve the performance and yield of the integrated circuit. A static random access memory is a type of device that may include a memory array with memory cells each having two pass transistors, two latch transistors, and two load transistors. Preferably, the pass transistors have similar electrical characteristics to one another, the latch transistors have similar electrical characteristics to one another, and the load transistors have similar electrical characteristics to one another. A symmetric memory cell layout is one way of achieving similar electrical characteristics between the three pairs of transistors within the memory cell. Therefore, a small memory cell area is needed, and the memory cell layout should be symmetrical.

One attempt to reduce memory cell area and still have a symmetric memory cell layout is to split the word line over the memory cell. Regardless of the design rules, the amount of substrate area occupied by the split word line memory cell is inherently limited by the memory cell layout. Pass and latch transistors within a memory cell typically have about the same gate dielectric layer thickness. Because the ratio of the gain of the latch transistors to the gain of the pass transistors is typically greater than 1:1, the pass transistors typically have a large channel width to channel length ratio. The large channel width to channel length ratio typically occupies a large memory cell area.

SUMMARY OF THE INVENTION

The present invention may include a static random access memory cell and a method of forming the memory cell, wherein the memory cell comprises an active region and a first layer. The active region includes a first segment, a second segment, and a third segment, wherein 1) the first segment has an adjacent end and a distal end and has a first length that generally extends a first distance in a first direction; 2) the second segment has an adjacent end and a distal end and has a second length that generally extends a second distance in the first direction; and 3) the third segment has a first end and a second end and has a third length that generally extends in a second direction, which is generally perpendicular to the first direction, wherein the adjacent ends of the first and second segments lies near the first and second ends of the third segment, respectively. The first layer includes a fourth segment, a fifth segment, and a sixth segment, wherein 1) the fourth segment has an adjacent end and a distal end, has a fourth length that generally extends a fourth distance in the first direction, and lies over the first segment, wherein the fourth distance is shorter than the first distance; 2) the fifth segment has an adjacent end and a distal end, has a fifth length that generally extends a fifth distance in the first direction, and lies over the second segment, wherein the fifth distance is shorter than the second distance; and 3) the sixth segment has a first end and a second end, has a sixth length that generally extends in the second direction, and lies over the third segment, wherein the adjacent end of the fourth and fifth segments lie near the first and second ends of the sixth segment, respectively.

The present invention may also include a static random access memory cell and a method of forming the memory cell, wherein the memory cell comprises: 1) a first latch transistor including a source region, a drain region, a channel region, and a gate electrode; 2) a first storage node, wherein the first latch transistor is associated with the first storage node; 3) a second latch transistor including a source region, a drain region, a channel region, and a gate electrode; 4) a second storage node, wherein the second latch transistor is associated with the second storage node; 5) a first conductive member that acts as the gate electrode for the first latch transistor and is electrically connected to the second storage node; and 6) a second conductive member that acts as the gate electrode for the second latch transistor and is electrically connected to the first storage node, wherein part of the second conductive member lies over part of the first conductive member.

Many benefits are seen with embodiments of the present invention that are described below. The memory cell may be compact because the memory cell design more efficiently uses substrate area by forming the active regions of the load transistors over the active regions of the latch transistors and using shared gate electrodes between each pair of latch and load transistors. The memory cell has a single word line to help reduce the memory cell area. The use of different gate dielectric layer thickness between the pass and latch transistors allows a smaller channel width to channel length ratio to be used with the pass transistors and typically results in a smaller memory cell area. The memory cell layout and fabrication is relatively symmetric. Many of the steps that affect one of the pass, latch, or load transistors also affect the other pass, latch, or load transistor. The memory cell also includes elevated source/drain regions that generally reduce the likelihood of additional planarization process sequences. The drain regions of the load transistors do not lie directly over the shared gate electrode and helps to reduce leakage current.

Other objects, features, and advantages of the present invention will be apparent from the accompanying drawings and from the detailed description that follows.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

The present invention may include a static random access memory cell and a method of forming the memory cell, wherein the memory cell comprises an active region and a first layer. The active region and the first layer have similar shapes. The pass and latch transistors have source/drain, source, drain, and channel regions that are formed along the active region. The source, drain, and channel regions of the load transistors are formed in the first layer. Shared gate electrodes are formed between the active region and the first layer, and each shared gate electrode is a gate electrode for a pair of latch and load transistors. The present invention may also include a static random access memory cell and a method of forming the memory cell, wherein the memory cell comprises gate electrodes for the latch transistors, wherein a gate electrode of one of the latch transistors crosses over another gate electrode of the other latch transistor.

Many benefits are seen with embodiments of the present invention that are described below. The memory cell may be compact because the memory cell design more efficiently uses substrate area by forming the active regions of the load transistors over the active regions of the latch transistors and using shared gate electrodes between each pair of latch and load transistors. The memory cell has a single word line to help reduce the memory cell area. The use of different gate dielectric layer thickness between the pass and latch transistors allows a smaller channel width to channel length ratio to be used with the pass transistors and typically results in a smaller memory cell area. The memory cell layout and fabrication is relatively symmetric. Many of the steps that affect one of the pass, latch, or load transistors also affect the other pass, latch, or load transistor. The memory cell also includes elevated source/drain regions that generally reduce the likelihood of additional planarization process sequences. The drain regions of the load transistors do not lie directly over the shared gate electrode and helps to reduce leakage current.

EXAMPLE 1

Figure 1:
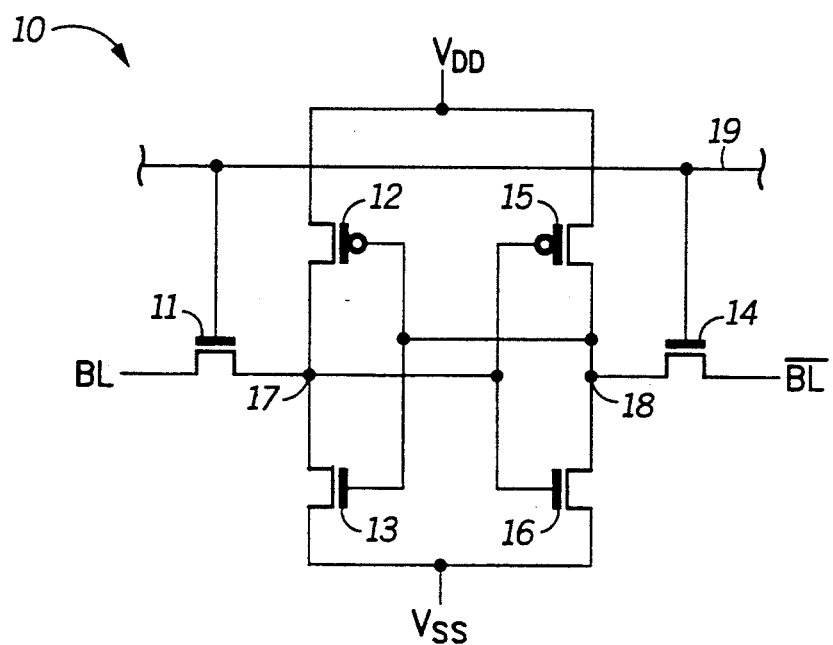
FIG. 1 includes a circuit diagram of a six-transistor static-random-access memory cell. (Prior art)

FIG. 1 includes a circuit diagram of a six-transistor static-random-access memory cell 10. The memory cell 10 includes a first storage node 17 and a second storage node 18. A first pass transistor 11, a first latch transistor 13, and a first load transistor 12 are associated with the first storage node 17, and a second pass transistor 14, a second latch transistor 16, and a second load transistor 15 are associated with the second storage node 18. The gate electrodes for the first latch transistor 13 and the first load transistor 12 are electrically connected to the second storage node 18, and the gate electrodes for the second latch transistor 16 and the second load transistor 15 are electrically connected to the first storage node 17. The gate electrodes for the pass transistors 11 and 14 are part of a word line 19. A source/drain region of the first pass transistor 11 is connected to a first bit line, and a source/drain region of the second pass transistor 14 is connected to a second bit line. The first bit line has opposite logic of the second bit line. In other words, if the first bit line is "high", the second bit line is "low", or vice versa. The source regions of the latch transistors 13 and 16 are electrically connected to one another and to a $V_{SS}$ electrode, which is at about ground potential when the memory cell is operating. The source regions of the load transistors 12 and 15 are electrically connected to one another and to a $V_{DD}$ electrode, which is at a potential in a range of about 2-5 volts when the memory cell is operating. The pass and latch transistors are n-channel transistors, and the load transistors are p-channel transistors.

Figure 2:
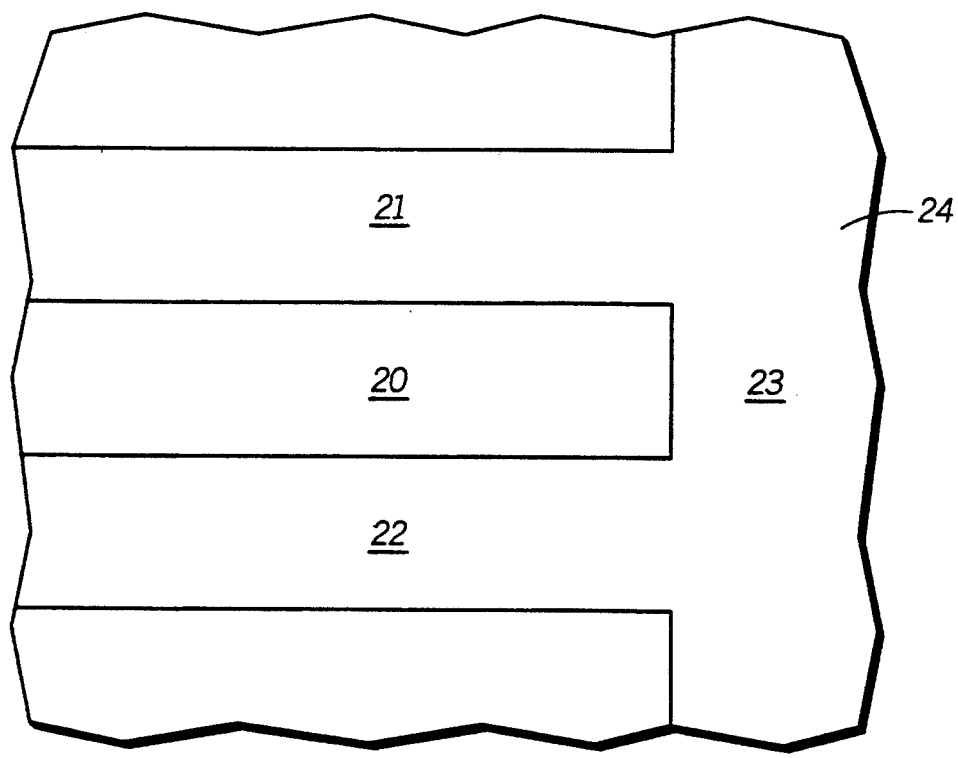
FIGS. 2-14 each includes a top view or a cross sectional view of a portion of a substrate at various process steps in forming a six-transistor static-random-access memory cell in accordance with one embodiment of the present invention.
Figure 3:
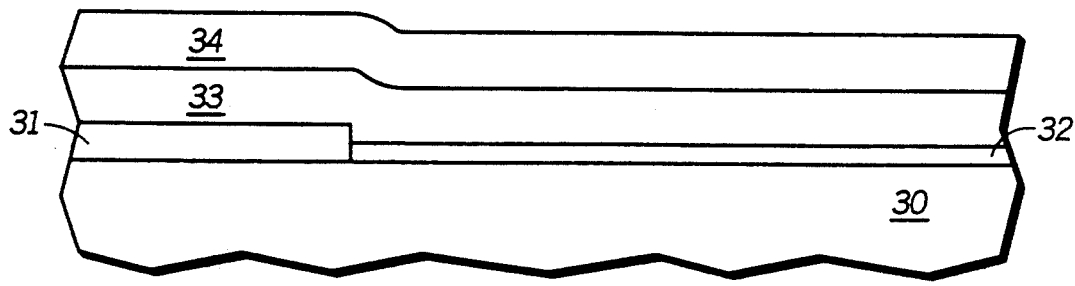

FIG. 2 includes a top view of a lightly p-type doped monocrystalline silicon substrate (substrate) having a field isolation regions 20 and an active region 24 that lies within the substrate. The active region 24 includes a first segment 21, a second segment 22, and a third segment 23. The first segment 21 and the second segment 22 have lengths that have about the same length and are generally parallel to one another. Each has an adjacent end that is closer to the right-hand portion of FIG. 2 a distal end that is closer to the left-hand portion of FIG. 2. In addition, the first and second segments each includes a pass section that lies near the distal end, a latch section that lies near the adjacent end, and a node section that lies between the pass and latch sections. The third segment 23 has a length that is generally perpendicular to the lengths of the first and second segments and is connected to the first and second segments at their adjacent ends. A first gate dielectric layer 31 is formed by thermally growing silicon dioxide from the active region 24 of the substrate 30. The first gate dielectric layer 31 is selectively etched using conventional lithographic and etching methods, so that the first gate dielectric layer 31 remains over the pass sections of the first and second segments but is removed from the rest of the active region 24 as shown in FIG. 3. A second gate dielectric layer 32 about 55 angstroms thick is formed by thermally growing silicon dioxide from the exposed portions of the active region 24. During the formation of the second gate dielectric layer 32, the first dielectric layer 31 is further oxidized, such that the first gate dielectric layer 31 is about 105 angstroms thick after the second gate dielectric layer 32 is formed.

A first polycide layer 33 is formed over the substrate as shown in FIG. 3 and includes a first amorphous silicon layer, a polycrystalline silicon (polysilicon) layer, and a first refractory metal silicide layer. The first amorphous silicon layer is formed by depositing amorphous silicon over the substrate. The first polysilicon layer is formed over the first amorphous silicon layer by depositing polysilicon, which is in-situ doped with phosphorus to a relatively high concentration. The first refractory metal silicide layer including tungsten silicide is formed over the second polysilicon layer and annealed prior to patterning the first polycide layer. Therefore, a first polycide layer 33 is formed and includes the first amorphous silicon layer, the first polysilicon layer, and the first refractory metal silicide layer. For simplicity the three-layered film is illustrated as the first polycide layer 33 in FIG. 3 and has a total thickness of about 2000 angstroms.

Figure 4:
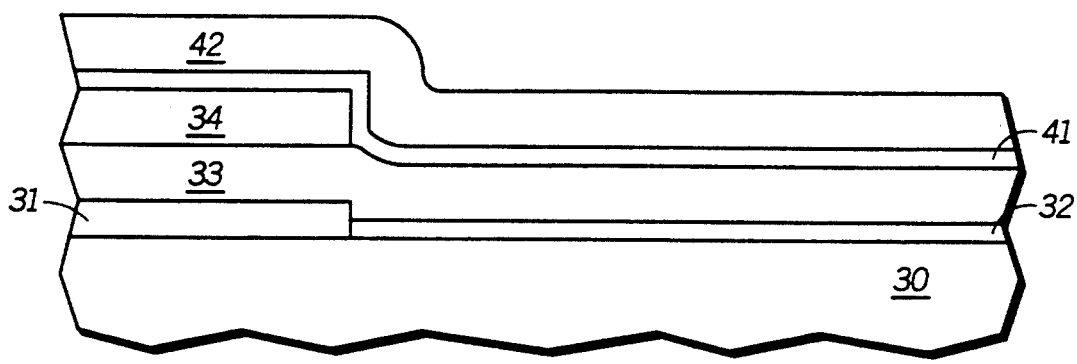

A first insulating layer 34 about 2500 angstroms thick is formed over the first polycide layer 33 by depositing silicon dioxide using an ambient including tetraethylorthosilicate (TEOS) as shown in FIG. 3. The first insulating layer 34 is selectively etched using conventional lithographic and etching methods. A second insulating layer 41 is formed over the substrate by depositing about 100 angstroms of silicon dioxide using an ambient including TEOS, and a first capping layer 42 is formed by depositing about 1000 angstroms of silicon nitride over the second insulating layer 41 as shown in FIG. 4.

Figure 5:
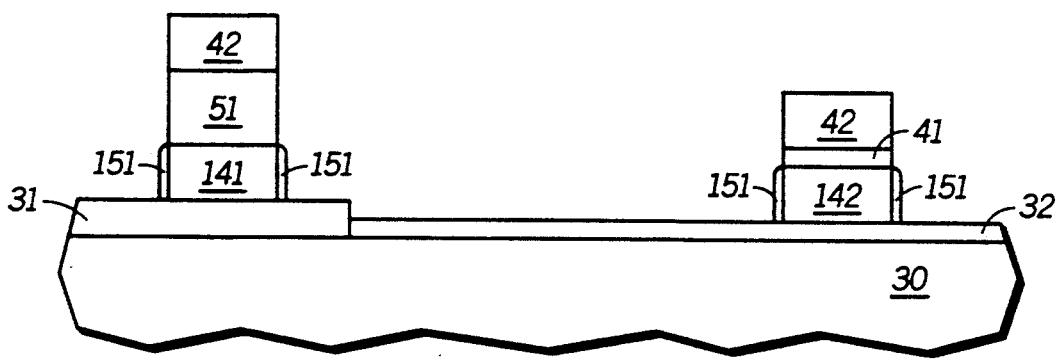
Figure 6:
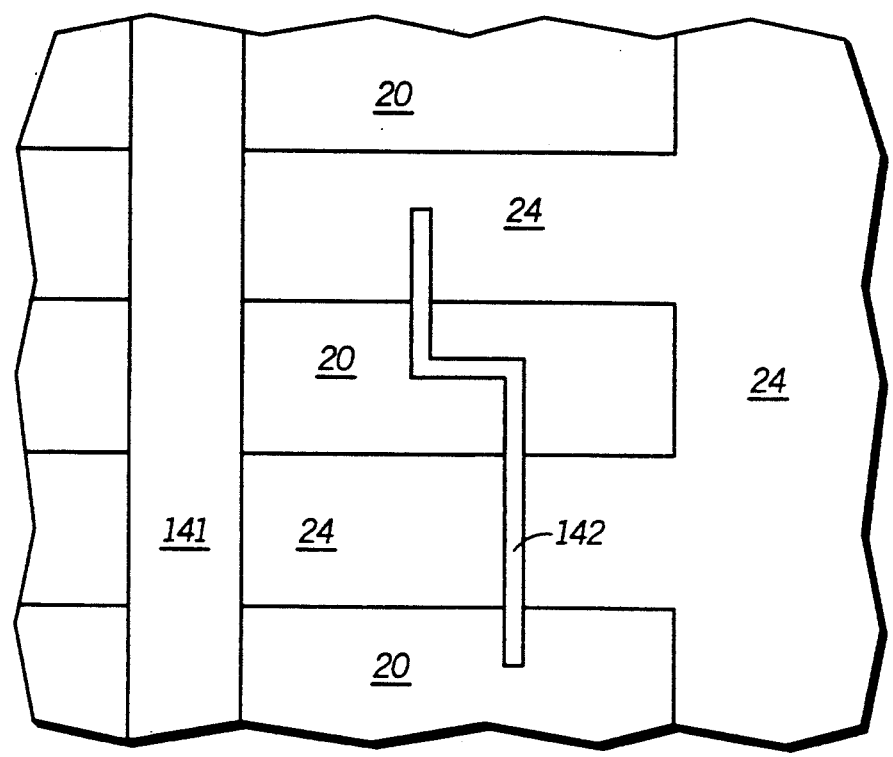

A first gate electrode masking layer including two gate electrode masking members (not shown) is formed over the first capping layer 42. The layers that lie between the masking layer and the first and second gate dielectric layers 31 and 32 are selectively etched to form a first conductive member 141, and a second conductive member 142 as shown in FIG. 5. The conductive members 141 and 142 have shapes similar to islands and include the first polycide layer 33. The first conductive member 141 acts as gate electrodes for the pass transistors, lies over the pass sections of the first and second segments, and has a length that is generally perpendicular to the length of the first and second segments of the active region 24 as shown in FIG. 6. The first conductive member 141 forms a word line for the memory cell. The second conductive member 142 acts as the shared gate electrode for the latch and load transistors 16 and 15 and lies over the latch section of the second segment. The portion of the second conductive member 142 that lies over the active region 24 is generally perpendicular to the length of the second segment. The second conductive members 142 extends over the field isolation region 20 and over the node section of the first segment of the active region 24. The first gate electrode masking layer is removed after the first and second conductive members 141 and 142 are formed. FIG. 5 includes insulating member 51, which is the combination of the first insulating layer 34 and the second insulating layer 41 that lie over the first conductive member 141.

A first protective layer 151 is formed by thermally growing silicon dioxide about 100 angstroms thick from the exposed surfaces of the first and second conductive members 141 and 142 as shown in FIG. 5. For simplicity, the first protective layer 151 is not included in FIGS. 6-14, except for FIG. 7. The second gate dielectric layer is selectively etched using conventional lithographic and etching methods, so that the second gate dielectric layer is removed over the latch section of the first segment of the active region 24 and the node section of the second segment of the active region 24.

Figure 7:
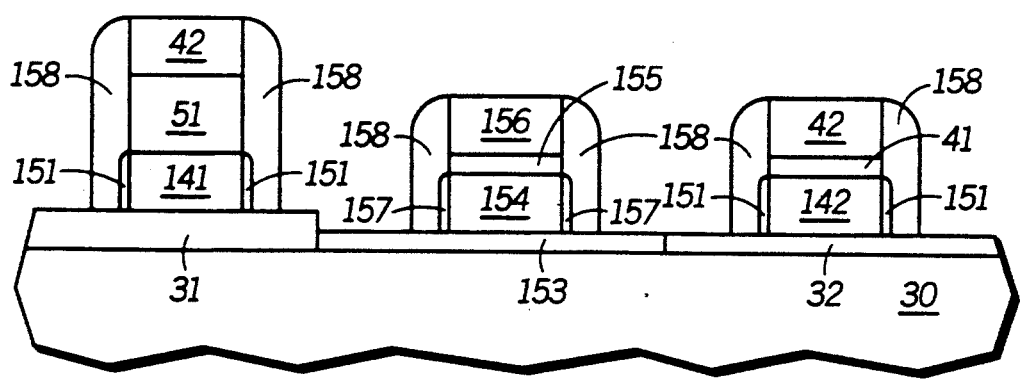

Referring to FIG. 7, a third gate dielectric layer 153 about 55 angstroms thick is formed by thermally growing silicon dioxide from silicon within the latch section of the first segment and the node section of the second segment of the active region 24. A second polycide layer 154, fourth insulating layer 155, and a second capping layer 156 are formed over the substrate in a manner similar to and having about the same thickness as the first polycide layer 33, second insulating layer 41, and the first capping layer 42.

Figure 8:
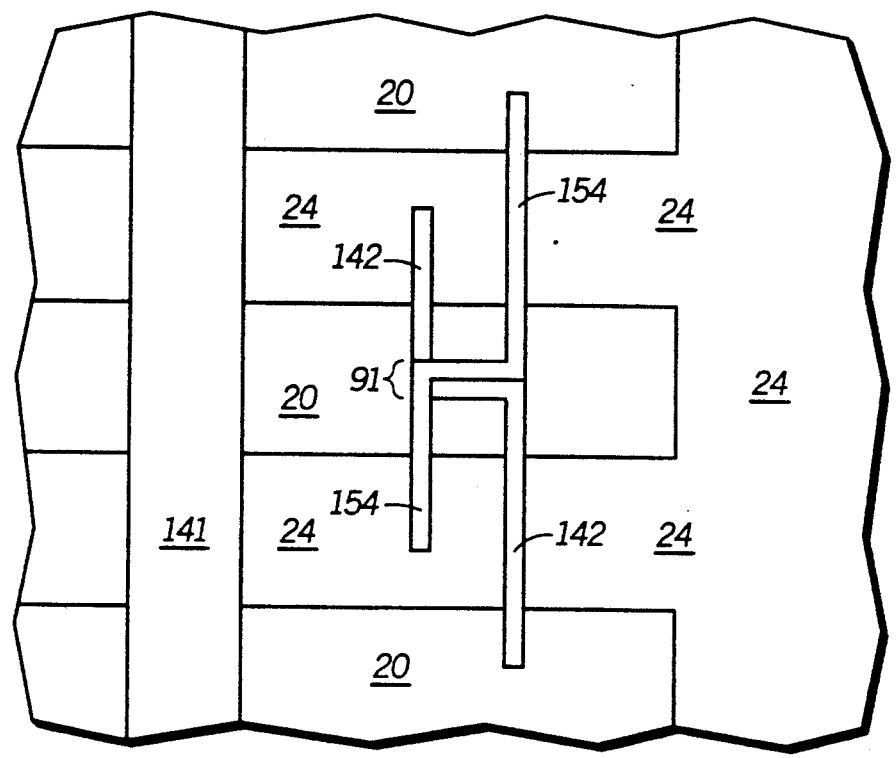

A second gate electrode masking layer including a masking member (not shown) is formed over the second capping layer 156. The layers that lie between masking layer and the third gate dielectric layer 153 are selectively etched to form a third conductive member 154. The third conductive member 154 acts as the shared gate electrode for the latch and load transistors 13 and 12 and lies over the latch section of the first segment. The portion of the third conductive member 154 that lies over the active region 24 is generally perpendicular to the length of the first segment. The third conductive members 154 extends over the field isolation region 20 and over at least a part of the node section of the second segment of the active region 24. FIG. 7 includes an illustrative of a cross sectional view of the memory cell along the second segment of the active region. FIG. 8 includes a top view of the memory cell showing the relationship between the first, second, and third conductive members 141, 142, and 154, the field isolation layer 20 and the active region 24. The portion of the third conductive member 154 that overlaps the second conductive member 142 is illustrated by a bracket 91. Part of the first capping layer 42 lies between the second conductive layer 142 and the overlapping portion of the third conductive member 154. The second gate electrode masking layer is removed.

A second protective layer 157 is formed in a manner similar to and having about the same thickness as the first protective layer 151. First sidewall spacers 158 are formed adjacent the first, second, and third conductive members 141, 142, and 154 by depositing about 600 angstroms of silicon nitride and anisotropically etching the silicon nitride using conventional methods. The second protective layer 157 and first sidewall spacers 158 are shown in FIG. 7. For simplicity, the protective layers and sidewall spacers are not shown in any of the top views of the memory cell. The third gate dielectric layer 153 is selectively etched to remove portions of the third gate dielectric layer 153 that are not covered by the three gate structures.

Figure 9:
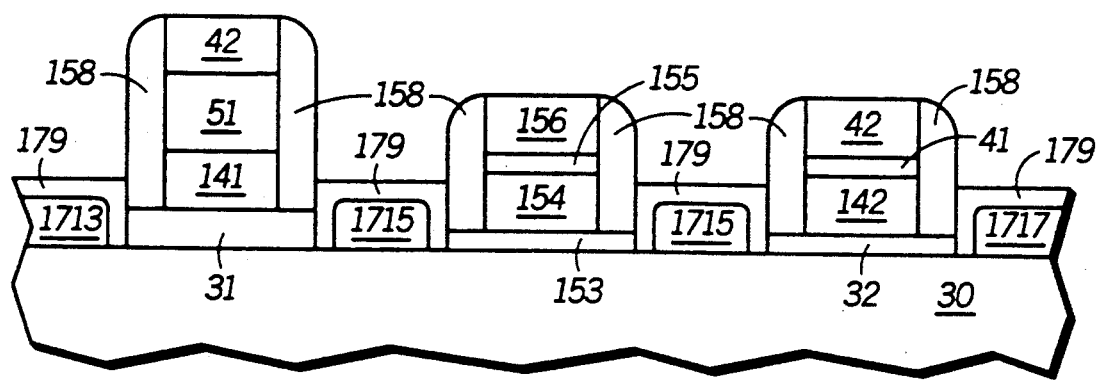
Figure 10:
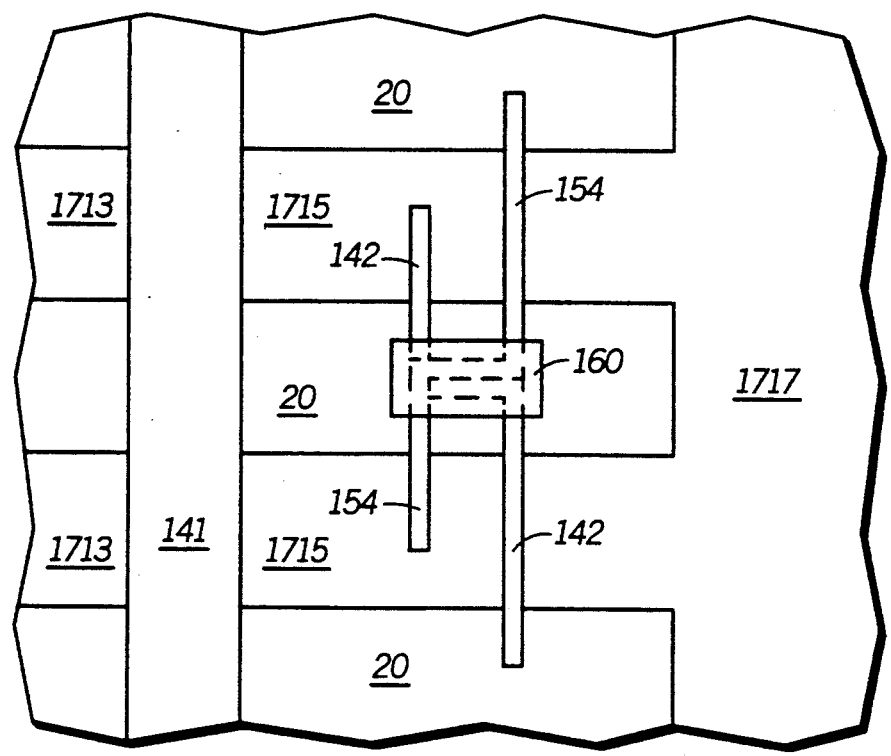

Self-aligned epitaxial silicon islands (silicon islands) 1713, 1715, and 1717 are formed by depositing silicon such that epitaxial silicon is deposited to a thickness of about 1500 angstroms over the exposed areas of the active region 24. The silicon islands are heavily doped with an n-type dopant to make them conductive. The doping of the silicon islands may be performed in situ or as a separate furnace doping or ion implanting step. If desired, the silicon islands may be p-type doped if the pass and latch transistors would be p-channel transistors. The silicon islands form elevated source/drain, source, and drain regions for the memory cell. An oxide layer 179 is formed by thermally growing silicon dioxide from the islands as shown in FIG. 9. The oxide layer 179 is about 1000 angstroms thick over the silicon islands, but is thinner along the sides of the silicon islands although FIG. 9 does not clearly illustrate this due to the complexity of the drawings. A patch-shaped masking layer 160 is formed over portions of the second and third conductive members 142 and 154 that lie over the field isolation region 20 as shown in FIG. 10. The patch-shaped masking layer 160 comprises silicon dioxide about 200 angstroms thick and is deposited and patterned using conventional methods.

Figure 11:
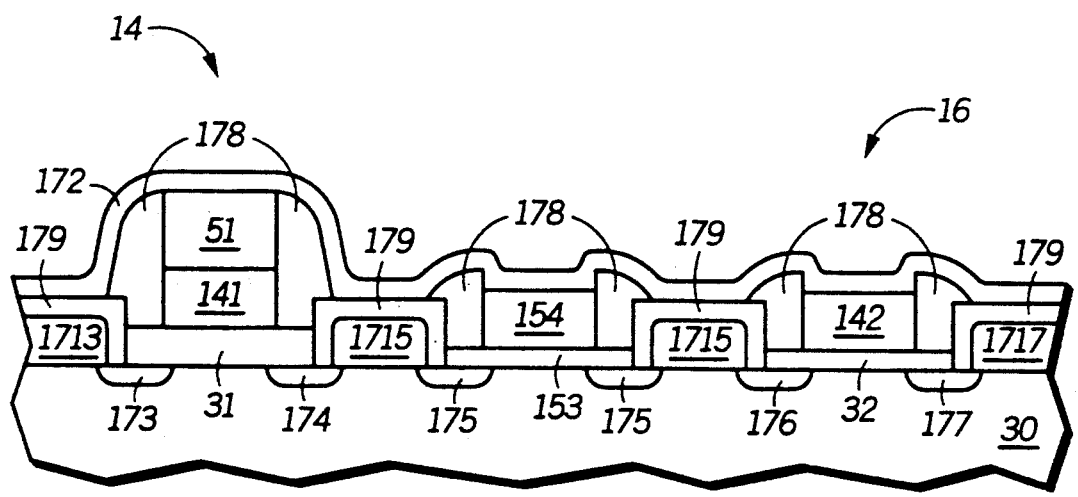

The second capping layer 156 and the portions of both the first sidewall spacers 158 and the first capping layer 42, which are not covered by the mask-shaped patch 160, are removed. The memory cell is doped by ion implanting phosphorous ions to a dose of about 5E13 ions per square centimeter to form doped regions 173-177 as shown in FIG. 11. A subsequent thermal cycle diffuses dopants from the doped regions 173-177 and silicon islands 1713, 1715, and 1717. The diffusion electrically connects each of the doped region 173-177 to one of the silicon islands 1713, 1715, and 1717. Second sidewall spacers 178 are formed by depositing a layer of silicon nitride and anisotropically etching the silicon nitride. The second sidewall spacers 178 overlap slightly onto the silicon islands adjacent the second sidewall spacers 178.

At this point in the process, the first level of transistors for the memory cell are formed and include the pass transistors and the latch transistors. FIG. 11 includes a cross sectional view of the memory cell along the second segment of the active region 24. The silicon island 1713 and the doped region 173 form a source/drain region for the pass transistor 14, and the silicon island 1715 and the doped region 174 form the other source/drain region for the pass transistor 14. The pass transistor 14 also includes the first gate dielectric layer 31 and the first conductive member 141 that acts as the gate electrode for the pass transistor 14. The silicon island 1715 and the doped region 176 form the drain region for the latch transistor 16, and the silicon island 1717 and the doped region 177 form the source region for the latch transistor 16. The latch transistor also includes the second gate dielectric layer 32 and the second conductive member 142 that acts as the shared gate electrode for the latch transistor 16 and the subsequently formed load transistor 15. Pass and latch transistors 11 and 13 have similar regions and layers and lie along the first segment of the active region 24.

Exposed portions of the second and fourth insulating layers 41 and 155 are removed by selectively etching the memory cell with an oxide etching solution. A fourth gate dielectric layer 172 is formed by depositing and densifying about 100 angstroms of silicon dioxide using an ambient including TEOS as shown in FIG. 11. A node contact masking layer (not shown) including node contact openings is formed. The openings expose portions of the second and third conductive members 142 and 154 that lie over the node sections of the first and second segments. The fourth gate dielectric layer 172 and the oxide layer 179 are selectively etched to remove the exposed portions of the gate dielectric layer 172 and the oxide layer 179. The node contact masking layer is then removed.

Figure 12:
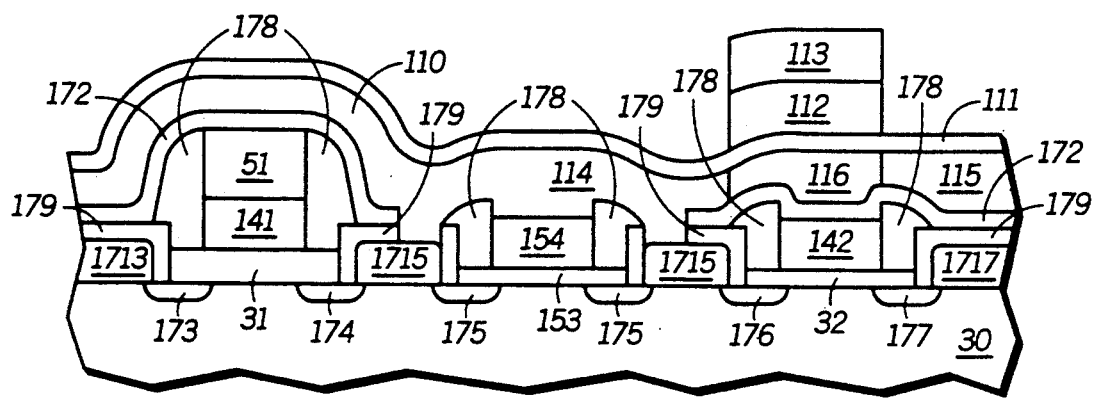

A germanium-silicon (Ge-Si) layer 110 is formed over the substrate by depositing germanium-silicon and annealing the Ge-Si layer 110 to form a crystalline phase as shown in FIG. 12. The Ge-Si layer 110 generally lies at about the second or $V_{DD}$ level. The Ge-Si layer 110 is doped with an n-type dopant in situ or as a separate doping step using a conventional method. Oxide layers over the Ge-Si layer 110, if any, are removed and a third protective layer 111 is formed by depositing silicon dioxide over the Ge-Si layer 110, and the Ge-Si layer 110 is doped by ion implanting n-type ions to a dose of about 1E12 ions per square centimeter. A third capping layer 112 is formed by depositing silicon nitride to a thickness of about 1500 angstroms. A cap masking layer is formed and includes cap masking members 113 that lie over the shared gate electrode portions of the second and third conductive members 142 and 154 that lie over the latch sections of the first and second segments of the active region. The masking members 113 extend beyond the shared gate electrode towards the node sections of the first and second segments of the active region 24. The third capping layer is selectively etched to form a patterned third capping layer 112 over the Ge-Si layer 110. The Ge-Si layer 110 is selectively doped by ion implanting p-type ions to form heavily p-type doped regions 114 and 115 within the Ge-Si layer 110. The portions of the Ge-Si layer 110 that are covered by the cap masking member 113 and the patterned third capping layer 112 are virtually undoped by the p-type ion implantation and form the channel regions 116 of the load transistors 12 and 15. The cap masking member 113 is removed.

Figure 13:
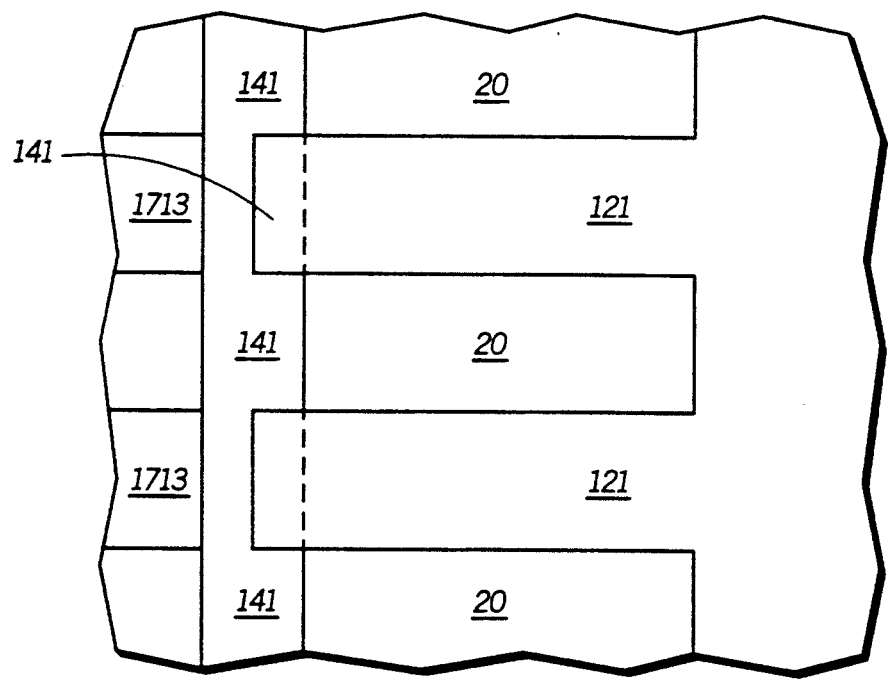

A load transistor masking layer is formed and includes a load transistor masking member 121 that lies over and is generally coincident with the third segment, the node and latch sections, and part of the pass sections of the first and second segments of the active region 24. FIG. 13 includes a top view of the memory cell and illustrates the relationship between the load transistor masking member 121 and other portions of the memory cell. FIG. 13 includes the active region 24, the first conductive member 141, and the field isolation region 20. The second and third conductive members 142 and 154 and the patch-shaped masking member 160 have been omitted from FIG. 13 for simplicity. The load transistor masking member 121 has a shape similar to the active region 24, but does not cover all of the pass sections of the first and second segments. The first conductive member 141 includes a strip that extends between the top and bottom of FIG. 13. The dashed lines with respect to the first conductive member 141 illustrate where it is covered by the load transistor masking member 121. The Ge-Si layer 110 and the third protective layer 111 are selectively etched to remove those portions of the layers that are not covered by the load transistor masking member 121. The masking member is removed after the selective etching. The third protective layer 111 not covered by the cap 112 is removed using a conventional method.

Figure 14:
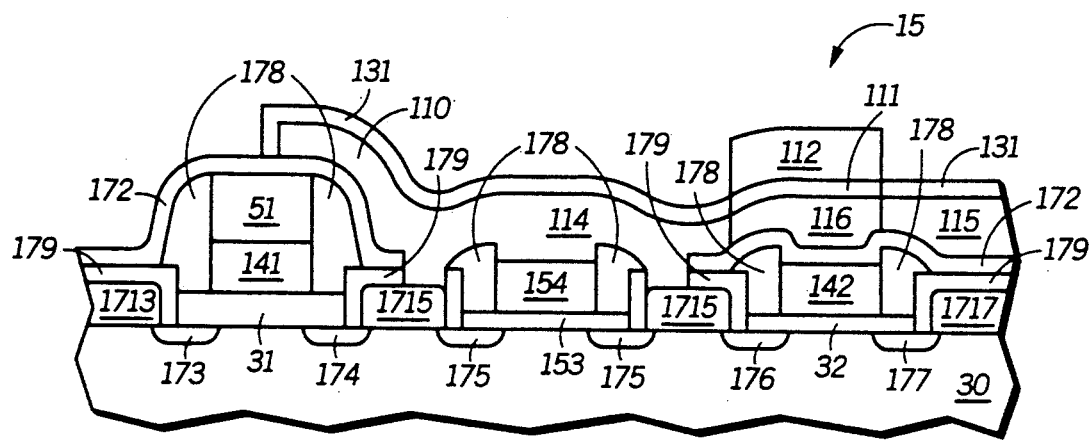

A titanium layer is deposited over the substrate and is annealed to form a titanium-germanium-silicon compound 131 where the titanium reacts with the exposed portions of the Ge-Si layer 110 as shown in FIG. 14. The unreacted titanium is removed using a conventional method. FIG. 14 includes an illustration of a cross sectional view of the memory cell including the pass transistor 14, the latch transistor 16, and the load transistor 15.

The transistors within the memory cell are formed and are shown in FIG. 14. The pass and latch transistors 14 and 16 are described above. The second storage node 18 includes the doped regions 174, 175, and 176, the silicon island 1715 that lies over the node section of the second segment, and the doped region 114. The second storage node 18 is electrically connected to the shared gate electrode for the latch and load transistors 13 and 12 via the third conductive member 154. The doped region 114 and the titanium silicide layer 131 to the left of the patterned third capping layer 112 act as the drain region of the load transistor 15 and is electrically connected to the second storage node 18. The doped region 115 and the titanium-germanium-silicon compound 131 to the right of the patterned third capping layer 112 act as the source region for the load transistor 15 and is electrically connected to the source region of the other load transistor 12. The load transistors 12 and 15 are thin-film transistors because their active regions, which each includes doped regions 114 and 116 and channel region 115, comprise the Ge-Si layer 110, which is a thin-film layer. The other pass, latch, and load transistors 11-13 of the memory cell 10 are similar to the ones described.

A borophosphosilicate glass layer, contact openings and contacts, an interconnection level, a passivation layer, and if needed, additional insulation layers, via openings and vias, additional interconnection levels are formed to finished fabricating the memory cell. Conventional methods are used to form the layer, openings, contacts, and vias. None of these layers, openings, contacts, or vias are shown in FIG. 14. In the finished memory cell, one of the silicon islands 1713 is connected to a first bit line (not shown), the other silicon island 1713 is connected to a second bit line (not shown), the first conductive member 141 acts as a word line and is connected to a row decoder (not shown), the silicon island 1717 is connected to a $V_{SS}$ electrode (not shown), which is at about ground potential when the memory cell is operating, and the doped region 115 of the Ge-Si layer 110 is connected to a $V_{DD}$ electrode (not shown), which is at a potential in a range of about 2-5 volts when the cell is operating. During reading and writing operations, first and second bit lines typically are at opposite logic states, meaning one bit line is "low" and the other bit line is "high".

BENEFITS AND FABRICATION OPTIONS OF EXAMPLE 1

The embodiment described above includes many benefits. The memory cell may be compact because the memory cell design more efficiently uses substrate area. The second and third conductive members 142 and 154 are formed at different levels. Therefore, the third conductive member 154 may be formed to overlap the second conductive member 142. The overlapping conductive members more efficiently valuable substrate area and reduces memory cell area. The memory cell includes the active level, which is at about the same level as the upper surface of the active region that includes the doped regions 173-177. The memory cell also includes the $V_{DD}$ level, which is at about the same level as the Ge-Si layer 110. The pattern of the $V_{DD}$ level is similar to the pattern of the active level except that the pattern of the $V_{DD}$ level does not extend to bit line contacts for the memory cell 10. The memory cell includes the second and third conductive members 142 and 154, which act as the shared gate electrodes for the latch and load transistors 13, 16, 12, and 15. The source, channel, and drain regions of the load transistors 12 and 15 are formed over the source, channel, and drain regions of the latch transistors 13 and 16. Therefore, the memory cell area of the Example 1 embodiment is about the same as the area of a four-transistor memory cell.

Memory cell designs typically have latch transistors that have a higher gain than the pass transistors. The ratio of the gain of the latch transistor to the gain of the pass transistor may be about 3:1. A prior art memory cell design may have about the same thickness for the gate dielectric layers for the pass and latch transistors. In this case, the prior art memory cell may be designed such that the latch transistors have a small channel width to channel length ratio (W/L). The memory cell of the embodiment of Example 1 described above is designed such that the gate dielectric layer of the pass transistors is thicker than the gate dielectric layer of the latch transistors. Therefore, W/L for the latch transistors for the embodiment of Example 1 may be smaller than the prior art W/L for the prior art pass transistors and typically results in a smaller memory cell area. The border between the channel regions 116 of the load transistors 12 and 15 extend beyond edges of the shared gate electrodes towards the drain regions 114 of the load transistors 12 and 15 to reduce leakage current when the load transistors are off.

The memory cell layout and fabrication is relatively symmetric both physically and with respect to electrical properties. By symmetric, it is meant that the properties of the two pass transistors are about the same, the properties of the two latch transistors are about the same, and the properties of the two load transistors are about the same. Many steps that affect one of the pass, latch, or load transistors also affect the other pass, latch, or load transistor. The memory cell also includes elevated source/drain, source, and drain regions, which include the silicon islands 1713, 1715, and 1717, that generally reduce the likelihood of a planarization process sequence. The doped regions 173, 174, 176, and 177 may act as lightly-doped drain structures and reduce hot electron induced device degradation. The titanium-germanium-silicon compound 131 is self-aligned to the patterned third capping layer 112 over the channel regions 116 of the load transistors. Therefore, the titanium-germanium-silicon compound 131 does not need to be patterned saving at least one processing step. The dopants within the Ge-Si layer 110 typically activate at temperatures of less than about 750 degrees Celsius. Therefore, a relatively high temperature activation step, which is typically at least about 800 degrees Celsius and may cause undesired dopant diffusions at other layers, is not needed.

In alternate embodiments, the Ge-Si layer 110 may be replaced by or used with other semiconductor materials, such as silicon, germanium, diamond, III-V compounds, or the like. The use of exotic semiconductor materials is becoming more common. Group IV elements are hereinafter are defined as consisting of carbon, silicon, and germanium. Within the Group IV elements, an element's energy band gap and dopant activation energy both generally decrease with increasing atomic number. The use of any Group IV element, by itself or in combination with any other Group IV element, within an active region of a transistor should be generally interchangeable for most applications. Another part of a semiconductor device may have one Group IV element used in place or in combination with another Group IV element. For example, a conductive member that comprises polysilicon may comprise Ge-Si in an alternate embodiment. Process considerations, such as the stability of the Group IV oxides and formation of Group IV silicides, for example, may have a bearing on the selection of the Group IV element used, but these considerations are generally well known within the art.

One skilled in the art appreciates that conventional planar pass and latch transistors may be formed. Conventional planar pass and latch transistors typically have their source/drain, source, and drain regions completely within the substrate, rather than having elevated source/drain, source, and drain regions. A;so, a combination of at least one conventional planar transistor and at least one transistor with an elevated source/drain, source, or drain region may be used. If conventional planar transistors are formed, the patch-shaped masking layer 160 may not be needed. Depending on the actual memory cell layout and processing sequence, one skilled in the art knows whether the patch-shaped masking layer 160 is needed.

A variety of materials may be used in forming the memory cell. The memory cell may be formed using a substrate that is a monocrystalline material or a substrate that includes a layer of the monocrystalline material over an insulating layer such as silicon dioxide or sapphire, wherein the material includes silicon, germanium, diamond, or III-V semiconductor materials, such as gallium arsenide, for example. Gate dielectric layers may include silicon dioxide or silicon oxynitride. The insulating layers may include silicon dioxide, silicon oxynitride, or silicon nitride. A gate dielectric layer or an insulating layer may be thermally grown or deposited using silicon sources such as TEOS, diethylsilane, silane, disilane, chlorine-silicon compounds, and may be undoped or doped with boron or phosphorous dopants.

The masking layers may include photoresist or a layer of material that has different characteristics than another layer that the masking layer is to protect during a selective etching, oxidation, or doping step. For example, a patterned silicon nitride layer may be a masking layer during an oxide etching step. Some of the insulating layers may also be used as a masking layer. Therefore, the selection of the materials for the insulating layers may be limited because the insulating layer is also used as a masking layer. Considerations for the selection of materials for the capping layers is similar to the considerations for the masking layer materials. An n-type dopant may include phosphorus, arsenic, antimony, or the like, and a p-type dopant may include boron, boron difluoride, or the like. The conductivity types of the all doped layers may be reversed. Epitaxial silicon, amorphous silicon, and polysilicon layers may be interchanged with one another.

A refractory-metal silicide layer may comprise a material including titanium, tungsten, cobalt, molybdenum, tantalum, or the like. The use of the refractory-metal silicide layers are not needed and may be omitted, if desired, but some of the processing steps may need to be modified if the refractory metal silicide layers are omitted. Any of the refractory-metal silicide layers, including the titanium-germanium-silicide layer, may be formed such that all of the silicon layer or Ge-Si layer lying directly below the refractory metal is in part or completely consumed by a reaction that forms a silicide. In addition, the thickness of the refractory-metal silicide layers may be augmented by an additional silicide layer by sputtering and annealing the additional silicide layer or by depositing and reacting additional silicon (or Ge-Si) and refractory metal layers. The additional silicide layer may require an additional lithography and etching steps using conventional methods. The titanium of the titanium-germanium-silicide layer may be replaced by or also include tungsten, cobalt, molybdenum, tantalum, or the like. The germanium in the Ge-Si layer is not required, and amorphous silicon or polysilicon may be used in place of the Ge-Si layer 110.

In other embodiments, the patch-shaped masking layer 160 may be formed after the second conductive member 142 is formed and before the third gate dielectric layer 153 is formed. The layer 160 covers at least that portion of the second conductive member 142 where it is overlapped by the third conductive member 154. The layer 160 may cover other portions of the memory cell, if desired.

The memory cell of the embodiment of Example 1 may be used with design rules between about 0.25–1.0 micron. One skilled in the art appreciates that the invention may be used with design rules lower than 0.25 micron or greater than 1.0 micron. The first and third gate dielectric layers each has a thickness in a range of 40–100 angstroms; the second and fourth gate dielectric layers, the second and fourth insulating layers, and the protective layers each has a thickness in a range of 75–125 angstroms; the deposited layers used to form sidewall spacers each has a thickness in a range of 500–1000 angstroms; the first and third insulating layers each has a thickness in a range of 1500–3000 angstroms; the capping layers each has a thickness in a range of 500–2000 angstroms; the silicon islands and the Ge-Si layer each has a thickness in a range of 250–5000 angstroms; the oxide layer has a thickness in a range of 200–1000 angstroms; and the doped regions 173–177 are doped with a dose in a range of 1E13–5E14 ions per square centimeter. The patch-shaped masking layer 160 has a thickness in a range of 200–800 angstroms if it comprises silicon dioxide. The ranges listed above are meant to illustrate and not to be limiting.

The embodiment of Example 1 describes the formation of a memory cell. One skilled in the art appreciates that more than one memory cell may be formed using the embodiment of Example 1. In a similar manner, the memory cell may be part of a memory array of an integrated circuit that includes peripheral components. One skilled in the art is typically able to integrate the formation of the peripheral components and the memory array into a single process flow that forms the integrated circuit.

EXAMPLE 2

In another embodiment, the shared gate electrodes for the latch and load transistors are formed during the same processing steps. The process flow is similar to process flow of the embodiment of Example 1 described above up to and including the step of forming of the first capping layer 42.

Figure 15:
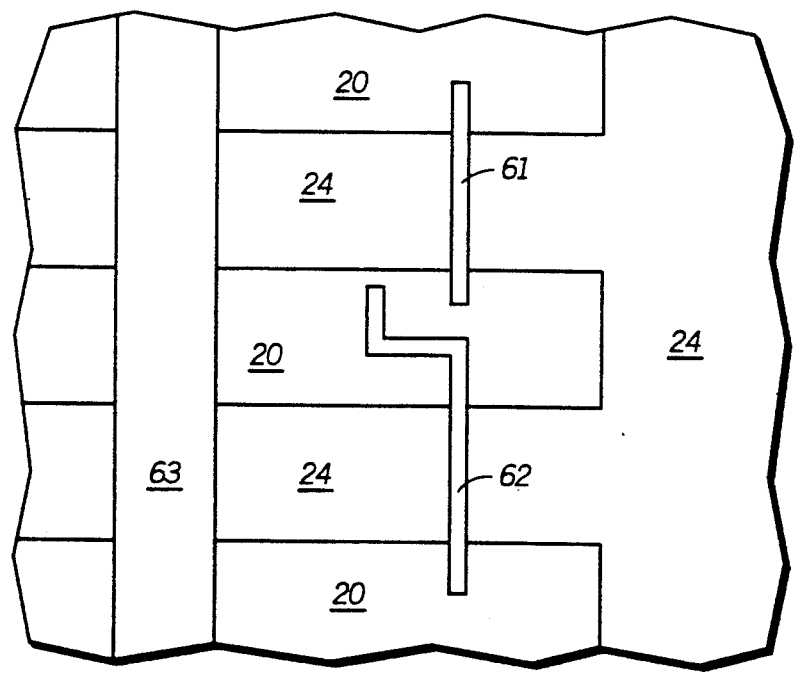
FIGS. 15-20 each includes a top view or a cross sectional view of a portion of a substrate at various process steps in forming a six-transistor static-random-access memory cell in accordance with another embodiment of the present invention.

A gate electrode masking layer including three gate electrode masking members (not shown) is formed over the first capping layer 42. The layers that lie between the masking layer and the first and second gate dielectric layers 31 and 32 are selectively etched to form a first conductive member 61, a second conductive member 62, and a third conductive member 63, which have shapes similar to islands and include the first polycide layer, as shown in FIG. 15. The first conductive member 61 acts as the shared gate electrode for the latch and load transistors 13 and 12 that lie over the latch section of the second segment. The length of portion of the first conductive member 61 is generally perpendicular to the length of the first segment. The second conductive member 62 acts as the shared gate electrode for the latch and load transistors 16 and 15 that lie over the latch section of the second segment. The length of the portion of the second conductive member 62 that forms the shared gate electrode is generally perpendicular to the length of the second segment. The first and second conductive members 61 and 62 extend onto the field isolation region 20 between the first and second segments. The third conductive member 63 acts as gate electrodes for the pass transistors 11 and 14, lies over the pass sections of the first and second segments, and has a length that is generally perpendicular to the length of the first and second segments of the active region 24. The third conductive member 63 forms a word line for the memory cell. The gate electrode masking layer is removed after the conductive members 61–63 are formed.

Figure 16:
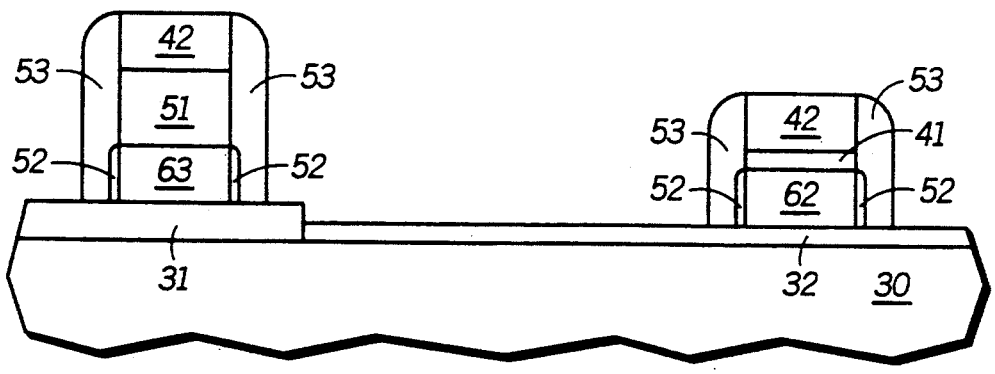

A first protective layer 52 is formed by thermally growing silicon dioxide about 100 angstroms thick from the exposed surfaces of the conductive members 61–63 as shown in FIG. 16. For simplicity, the first protective layer 52 is not included in FIGS. 17–20. First sidewall spacers 53 are formed adjacent the conductive members 61–63 in a similar manner to and having about the same thickness as the first sidewall spacers of the embodiment of Example 1. The portions of the first and second gate dielectric layers 31 and 32 not covered by the gate structures are removed.

Figure 17:
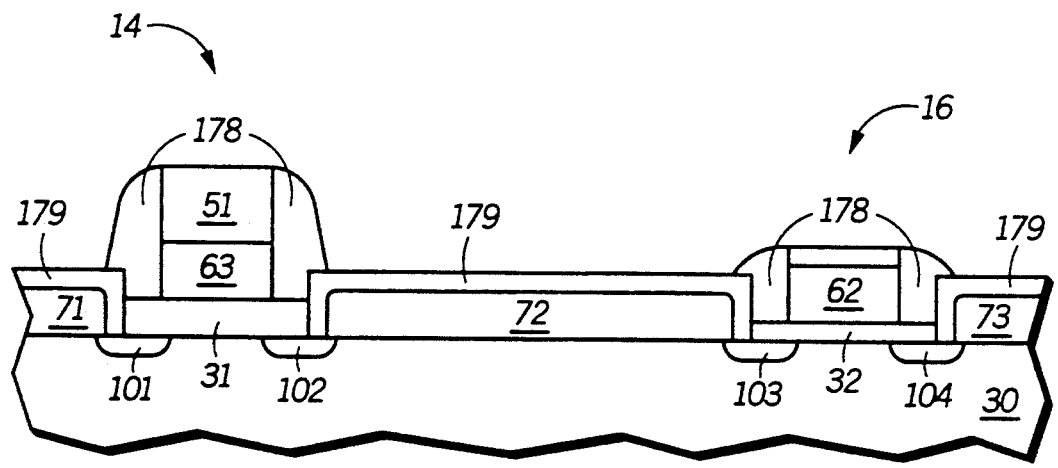
Figure 18:
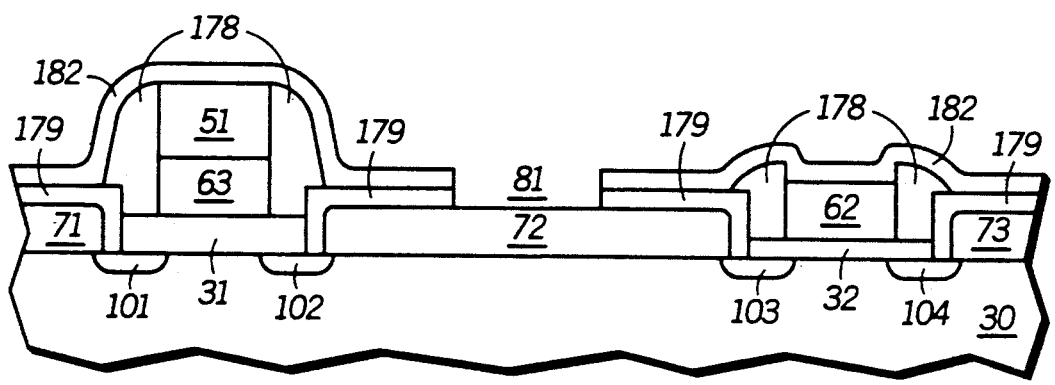

Self-aligned epitaxial silicon islands (silicon islands) 71–73 are formed in a similar manner to and about the same thickness as the silicon islands 1713, 1715, and 1717 of the embodiment of Example 1. The epitaxial silicon islands 71–73 are heavily doped with an n-type dopant to make the islands conductive. The islands 71–73 form elevated source/drain, source, and drain regions for the memory cell. An oxide layer 179 is formed in a manner similar to and having about the same thickness as the embodiment of Example 1. A patch-shaped masking layer 60 is formed over the first and second conductive members 61 and 62 in a manner similar to and having about the same thickness as the patch-shaped masking layer 160 of the embodiment of Example 1. Portions of the first sidewall spacers 53 and first capping layer 42, which are not covered by the patch-shaped masking layer 60 are removed. The memory cell is doped by ion implanting phosphorous ions to a dose of about 5E13 ions per square centimeter to form doped regions 101–104 as shown in FIG. 17. The doping and subsequent dopant activation electrically connects each of the doped region 101–104 to one of the silicon islands 71–73. Second sidewall spacers 178 are formed in a similar manner to and about the same thickness as the second sidewall spacers of the embodiment of Example 1.

At this point in the process, the first level of transistors of the memory cell are formed and include the pass transistors and the latch transistors. FIG. 17 includes a cross sectional view of the memory cell along the second segment of the active region 24. The silicon island 71 and the doped region 101 form a source/drain region for the pass transistor 14, and the silicon island 72 and the doped region 102 form the other source/drain region for the pass transistor 14. The pass transistor 14 also includes the first gate dielectric layer 31 and the third conductive member 63, which acts as the gate electrode for the pass transistor 14. The silicon island 72 and the doped region 103 form the drain region for the latch transistor 16, and the silicon island 73 and the doped region 104 form the source region for the latch transistor 16. The latch transistor also includes the second gate dielectric layer 32 and the second conductive member 62, which acts as the shared gate electrode for the latch transistor 16 and the subsequently formed load transistor 15. Pass and latch transistors 11 and 13 have similar regions and layers and lie along the first segment of the active region 24.

Figure 19:
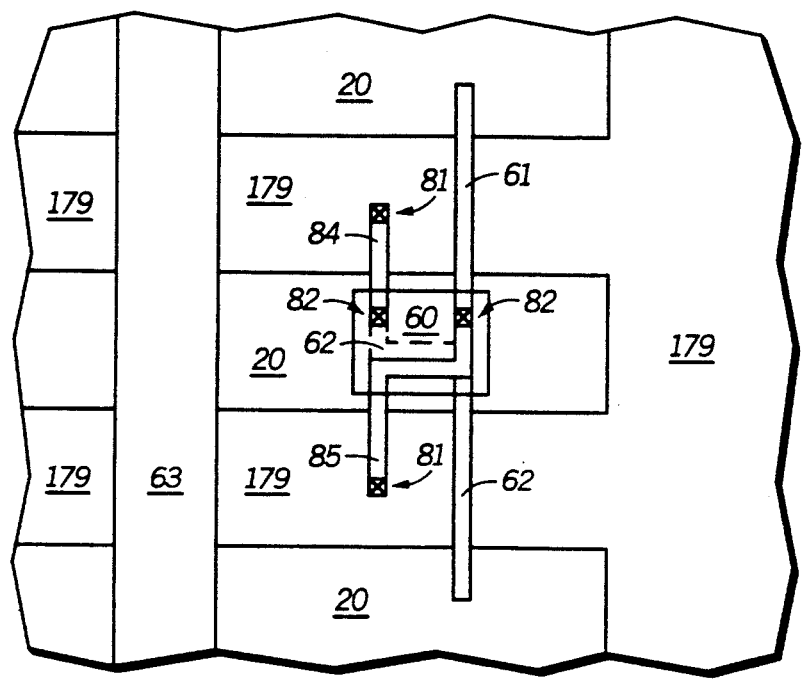

Strapping members are formed to connect the first and second conductive members 61 and 62 with the second and first storage nodes 18 and 17, respectively. Before forming the strapping members, openings to the first and second conductive members 61 and 62 and the silicon islands 72 are formed. The openings 82 are formed by selectively etching the patch-shaped masking layer 60 and the first capping layer 42 that lie over the first and second conductive members 61 and 62. Openings 81 are formed by selectively etching a portions of the oxide layer 179 that lies over each silicon island 72 so that a portion of the silicon island 72 is exposed. Strapping members 84 and 85 are formed by depositing and patterning a second polycide layer, which includes a layer of polysilicon and a layer of tungsten silicide. The tungsten silicide layer helps to reduce dopant migration into a subsequently formed p-type doped layer that will lie over a portion of the strapping members. The strapping member 84 electrically connects the first storage node 17 to the second conductive member 62, and the strapping member 85 electrically connects the second storage node 18 to the first conductive member 61 as shown in FIG. 19.

The second insulating layer 41 that lies over the first and second conductive members 61 and 62 is removed. A third gate dielectric layer 182 is formed in a similar manner to and having about the same thickness as the fourth gate dielectric layer 172 of the embodiment of Example 1. A strapping contact masking layer is formed and includes masking layer openings over portions of the silicon islands 72 and portions of the first and second conductive members 61 and 62 that lie over the field isolation region 20. The silicon dioxide exposed within the masking layer openings are removed to form the strapping contact openings 81 and 82 that expose portions of the silicon islands 72 and the first and second conductive members 61 and 62 as shown in FIG. 19.

Figure 20:
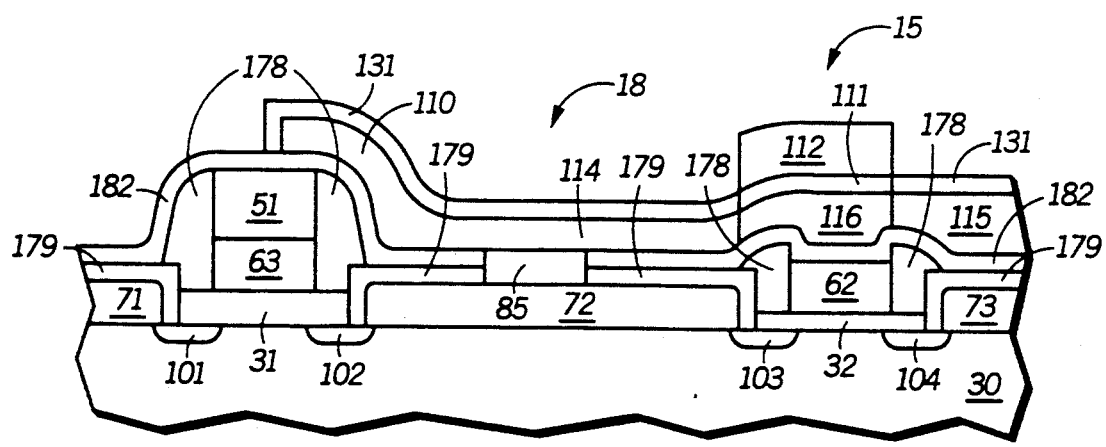

The rest of the fabrication steps performed to form the memory cell are similar to the embodiment of Example 1. The Ge-Si layer 110 is patterned using the load transistor masking member 121 as shown in FIG. 13. The first conductive member 141 of the embodiment of Example 1 is replaced by the third conductive member 63. FIG. 20 includes the memory cell of FIG. 18 after 1) the cap masking member 113 has been removed, 2) the Ge-Si layer 110 has been patterned, 3) the third protective layer 111 has been selectively etched, and 4) the titanium-germanium-silicon compound 131 has been formed. FIG. 20 includes the patterned Ge-Si layer 110, the patterned third protective layer 111, the cap 112, heavily p-type doped regions 114 and 115, and the channel region 116.

The transistors within the memory cell are formed and are shown in FIG. 20. The pass and latch transistors 14 and 16 are described above. The second storage node 18 includes the doped regions 102 and 103, the silicon islands 72, and doped region 114. The second storage node 18 is electrically connected to the shared gate electrode for the latch transistor 13 via the strapping member 85 and the first conductive member 61. The doped region 114 of the Ge-Si layer 110 and the titanium silicide layer 131 to the left of the cap 114 acts as the drain region of the load transistor 15 and is part of the second storage node 18. The doped region 115 acts as the source region for the load transistor 15 and is electrically connected to the source region of the other load transistor 12. The load transistors 12 and 15 are thin-film transistors because their active regions, which each includes doped regions 114 and 115 and channel region 116, comprise the Ge-Si layer 110, which is a thin-film layer. The other pass, latch, and load transistors 11–13 and the first storage node 17 of the memory cell 10 are similar to the ones described.

A borophosphosilicate glass layer, contact openings and contacts, an interconnection level, a passivation layer, and if needed, additional insulating layers, via openings and vias, and additional interconnection levels are formed to finished fabricating the memory cell. Conventional methods are used to form the layer, openings, contacts and vias. None of these layers, openings, contacts, or vias are shown in FIG. 20. In the finished memory cell, one of the silicon islands 71 is connected to a first bit line (not shown), the other silicon island 71 is connected to a second bit line (not shown), the third conductive member 63 acts as a word line and is connected to a row decoder (not shown), the silicon island 73 is connected to a $V_{SS}$ electrode (not shown), which is at about ground potential when the memory cell is operating, and the doped region 115 of the Ge-Si layer 110 is connected to a $V_{DD}$ electrode (not shown), which is at a potential in a range of about 2-5 volts when the cell is operating. During reading and writing operations, the first and second bit lines typically are at opposite logic states, meaning one bit line is "low" and the other bit line is "high".

The embodiment of Example 2 has many of the same benefits and fabrication options as the embodiment of Example 1. Unlike Example 1, the embodiment of Example 2 has the first, second, and third conductive members 61-63 formed during the same processing steps. Therefore, the electrical characteristics between the three pairs of transistors within the memory cell should be more symmetric. When compared to the embodiment of Example 1, the channel regions 116 of the load transistors 12 and 15 are further offset toward the left-hand side of the memory cell. The offset further decreases the leakage current of the load transistors. One skilled in the art appreciates that the actual location of the channel regions 116 may be optimized for a specific application. The embodiment of Example 2 has its first and second conductive members that only partially traverses the field oxide region 20 and requires strapping lines and strapping contacts. Many of the fabricating options of Example 1 also apply to Example 2. The third conductive member 63 may be formed separately from the first and second conductive members 61 and 62.

In the foregoing specification, the invention has been described with reference to specific embodiments thereof. It will, however, be evident that various modifications and changes can be made thereto without departing from the broader spirit or scope of the invention as set forth in the appended claims. The specification and drawings are, accordingly, to be regarded in an illustrative rather than a restrictive sense.

What is claimed is:

1. A method of forming a static random access memory cell comprising the steps of:

forming an active region lying within a semiconductor substrate having a first conductivity type and a primary surface, the active region lying adjacent to the primary surface and including a first segment, a second segment, and a third segment, wherein:

the first segment has an adjacent end has a first length that generally extends a first distance in a first direction;

the second segment has an adjacent end and has a second length that generally extends a second distance in the first direction; and the third segment has a first end and a second end and has a third length that generally extends in a second direction, which is generally perpendicular to the first direction, wherein the adjacent ends of the first and second segments lies near the first and second ends of the third segment, respectively;

forming a first pass transistor, a second pass transistor, a first latch transistor, and a second latch transistor, wherein:

each pass transistor includes a first source/drain region, a second source/drain region, a channel region, and a gate electrode;

each latch transistor includes a source region, a drain region, a channel region, a gate dielectric layer, and a gate electrode;

the gate dielectric layers of the latch transistors are formed simultaneously and the gate electrodes of the latch transistors are formed simultaneously;

the channel region of the first pass transistor, the channel region of the first latch transistor, part of each of the first and second source/drain regions of the first pass transistor, and part of each of the source and drain regions of the first latch transistor lie within the first segment;

the first source/drain region of the first pass transistor lies furthest from the adjacent end of the first segment and the source region of the first latch transistor lies closest to the adjacent end of the first segment; and the channel region of the second pass transistor, the channel region of the second latch transistor, part of each of the first and second source/drain regions of the second pass transistor, and part of each of the source and drain regions of the second latch transistor lie within the second segment; and the first source/drain region of the second pass transistor lies furthest from the adjacent end of the second segment and the source region of the second latch transistor lies the closest to the adjacent end of the second segment; and forming a first load transistor and a second load transistor within a layer having a fourth segment, a fifth segment, and a sixth segment, wherein:

the fourth segment has an adjacent end, has a fourth length that generally extends a fourth distance in the first direction, and lies over the first segment, wherein the fourth distance is shorter than the first distance;

the fifth segment has an adjacent end, has a fifth length that generally extends a fifth distance in the first direction, and lies over the second segment, wherein the fifth distance is shorter than the second distance;

the sixth segment has a first end and a second end, has a sixth length that generally extends in the second direction, and lies over the third segment, wherein the adjacent ends of the fourth and fifth segments lie near the first and seconds ends of the sixth segment, respectively;

the gate electrode of the first latch transistor also acts as a gate electrode for the first load transistor and the gate electrode of the second latch transistor also acts as a gate electrode for the second load transistor;

each load transistor includes a source region, a drain region, and a channel region, wherein the channel region has a drain-side edge lying at the drain region of its load transistor;

has a drain offset region, which is that portion of the channel region of its load transistors lying immediately adjacent to the drain-side edge and does not overlie the gate electrode of its load transistor; and does not have a source offset region;

the source, drain, and channel regions of the first load transistor lie within the fourth segment and the source region of the first load transistor lies nearest to the adjacent end of the fourth segment compared to the drain and channel regions of the first load transistor; and the source, drain, and channel regions of the second load transistor lie within the fifth segment and the source region of the second load transistor lies nearest to the adjacent end of the fifth segment compared to the drain and channel regions of the second load transistor, wherein the memory cell is configured such that:

the first source/drain region of the first pass transistor is electrically connected to a first bit line, the first source/drain region of the second pass transistor is electrically connected to a second bit line;

the gate electrodes of the pass transistors are part of a word line;

the source regions of the latch transistors are electrically connected to one another; and the source regions of the load transistors are electrically connected to one another.

2. The method of claim 1 further comprising the step of forming a first storage node and a second storage node, wherein:

the drain regions of the first latch and first load transistors, the second source/drain region of the first pass transistor, and the gate electrode of the second latch and second load transistors are electrically connected to one another to form the first storage node; and the drain regions of the second latch and second load transistors, the second source/drain region of the second pass transistor, and the gate electrode of the first latch and first load transistors are electrically connected to one another to form the second storage node.

3. The method of claim 1, wherein:

the first and second pass transistors each includes a first gate dielectric layer; and the gate dielectric layer of the pass transistors is thicker than the gate dielectric layer of the latch transistors.

4. The method of claim 1, wherein the first source/drain regions of the pass transistors, second source/drain regions of the pass transistors, source regions of the latch transistors, and drain regions of the latch transistors are formed by the steps comprising:

forming silicon islands adjacent to but not contacting any of the gate electrodes of the pass and latch transistors; and doping regions of the substrate adjacent to the primary surface with a dose in a range of 1E13–5E14 ions per square centimeter after forming the silicon islands and gate electrodes of the pass and latch transistors.

5. The method of claim 1, wherein the layer that is used to form the source, drain, and channel regions of the load transistors includes silicon and germanium.

6. The method of claim 1, further comprising the step of siliciding the source and drain regions of the load transistors.

7. The method of claim 6, wherein the step of siliciding forms a silicon-germanium-silicide compound.

* * * * *